(12) United States Patent
Nonoguchi et al.

(10) Patent No.: US 11,018,189 B2
(45) Date of Patent: May 25, 2021

(54) STORAGE APPARATUS

(71) Applicant: SONY SEMICONDUCTOR SOLUTIONS CORPORATION, Kanagawa (JP)

(72) Inventors: Seiji Nonoguchi, Kanagawa (JP); Katsuhisa Aratani, Kanagawa (JP); Kazuhiro Ohba, Tokyo (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/490,303

(22) PCT Filed: Mar. 15, 2018

(86) PCT No.: PCT/JP2018/010255
§ 371 (c)(1),
(2) Date: Aug. 30, 2019

(87) PCT Pub. No.: WO2018/190071
PCT Pub. Date: Oct. 18, 2018

(65) Prior Publication Data
US 2020/0052040 A1    Feb. 13, 2020

(30) Foreign Application Priority Data

Apr. 11, 2017 (JP) .............................. JP2017-078256

(51) Int. Cl.
*H01L 47/00* (2006.01)
*H01L 27/24* (2006.01)
(Continued)

(52) U.S. Cl.
CPC ........ *H01L 27/2481* (2013.01); *H01L 23/528* (2013.01); *H01L 27/11514* (2013.01); *H01L 27/224* (2013.01); *H01L 27/2409* (2013.01)

(58) Field of Classification Search
CPC .............. H01L 27/2481; H01L 23/528; H01L 27/11514; H01L 27/224; H01L 27/2409;
(Continued)

(56) References Cited

U.S. PATENT DOCUMENTS

| | | | |
|---|---|---|---|
| 2004/0170040 A1* | 9/2004 | Rinerson | G11C 13/003 365/26 |
| 2011/0140068 A1* | 6/2011 | Ozawa | H01L 27/249 257/4 |

(Continued)

FOREIGN PATENT DOCUMENTS

| | | |
|---|---|---|
| CN | 102473707 A | 5/2012 |
| CN | 104871313 A | 8/2015 |

(Continued)

OTHER PUBLICATIONS

International Search Report and Written Opinion of PCT Application No. PCT/JP2018/010255, dated May 15, 2018, 12 pages of ISRWO.

*Primary Examiner* — Robert G Bachner
(74) *Attorney, Agent, or Firm* — Chip Law Group (57) ABSTRACT

A storage apparatus includes a plurality of first wiring layers extending in one direction, a plurality of second wiring layers extending in another direction, and a plurality of memory cells provided in respective opposing regions in which the plurality of first wiring layers and the plurality of second wiring layers are opposed to each other. The plurality of memory cells each includes a selector element layer, a storage element layer, and an intermediate electrode layer provided between the selector element layer and the storage element layer. One or more of the selector element layer, the storage element layer, and the intermediate electrode layer is a common layer that is common between the plurality of memory cells, in which the plurality of memory cells is (Continued)

adjacent to each other and extends in the one direction or the other direction. The intermediate electrode layer includes a nonlinear resistive material.

16 Claims, 10 Drawing Sheets

(51) Int. Cl.
    *H01L 23/528*     (2006.01)
    *H01L 27/11514*     (2017.01)
    *H01L 27/22*     (2006.01)

(58) Field of Classification Search
    CPC ............. H01L 27/2418; H01L 27/2427; H01L 27/249; H01L 27/2472; H01L 27/11507
    See application file for complete search history.

(56) References Cited

U.S. PATENT DOCUMENTS

| | | |
|---|---|---|
| 2012/0104351 A1 | 5/2012 | Wei et al. |
| 2013/0128654 A1 | 5/2013 | Yoneda et al. |
| 2015/0325628 A1 | 11/2015 | Nonoguchi et al. |

FOREIGN PATENT DOCUMENTS

| | | |
|---|---|---|
| JP | 5558090 B2 | 7/2014 |
| JP | 2015-534720 A | 12/2015 |
| WO | 2012/001960 A1 | 1/2012 |
| WO | 2012/169198 A1 | 12/2012 |
| WO | 2014/103577 A1 | 7/2014 |
| WO | 2016/129306 A1 | 8/2016 |

\* cited by examiner

STORAGE APPARATUS

CROSS REFERENCE TO RELATED APPLICATIONS

This application is a U.S. National Phase of International Patent Application No. PCT/JP2018/010255 filed on Mar. 15, 2018, which claims priority benefit of Japanese Patent Application No. JP 2017-078256 filed in the Japan Patent Office on Apr. 11, 2017. Each of the above-referenced applications is hereby incorporated herein by reference in its entirety.

TECHNICAL FIELD

The present disclosure relates to a storage apparatus including, between intersecting wiring lines, a memory cell in which, for example, a selector element and a storage element are stacked with an intermediate electrode being disposed therebetween.

BACKGROUND ART

In recent years, there is a demand for memories or storages having increased capacity and increased speed. Meanwhile, flash memories, which are the mainstream of nonvolatile memory, are approaching their theoretical limit in terms of finer design. Thus, development has been underway for novel memories such as magnetic memories, phase change memories, and resistive random access memory. In particular, a cross point memory in combination with selector elements in a phase change memory and a resistive random access memory has been proposed.

The cross point memory has a structure in which a memory cell including a memory element and a selector element coupled in series is disposed at an intersecting point (cross point) between intersecting wiring lines. Specifically, in the cross point memory, two types of wiring layers, which are perpendicular to each other, are provided in a plural manner, and the memory cell is formed at each of the intersecting points of the wiring layers. That is, a plurality of memory cells is provided on one wiring layer. In other words, the cross point memory has a structure in which one wiring layer is shared between plural memory cells.

As for such a cross point memory, for example, Patent Literature 1 discloses a three dimensional memory array architecture in which a storage element material and a cell select material are continuously formed in a film manner, and are shared over multiple layering levels. Patent Literature 2 discloses a resistance-change memory cell array in which a variable resistance film, a conductive film, and a rectifying insulating film are provided, and the conductive layer is divided between adjacent horizontal electrodes with respect to one perpendicular electrode to secure a selection characteristic of the memory cell.

CITATION LIST

Patent Literature

Patent Literature 1: Japanese Unexamined Patent Application Publication (Published Japanese Translation of PCT Application) No. 2015-534720
Patent Literature 2: Japanese Patent No. 5558090

SUMMARY OF THE INVENTION

Incidentally, a cross point memory has a structure in which one wiring layer is shared between plural memory cells as described above. Thus, there is a possibility that a voltage is applied to memory cells other than the selected memory cell as well, which causes malfunction. For this reason, a cross point storage apparatus is required to have a high selection characteristic.

It is desirable to provide a storage apparatus that makes it possible to improve a selection characteristic.

A storage apparatus according to an embodiment of the present disclosure includes: a plurality of first wiring layers extending in one direction; a plurality of second wiring layers extending in another direction; and a plurality of memory cells provided in respective opposing regions in which the plurality of first wiring layers and the plurality of second wiring layers are opposed to each other. The plurality of memory cells each includes a selector element layer, a storage element layer, and an intermediate electrode layer provided between the selector element layer and the storage element layer. One or more of the selector element layer, the storage element layer, and the intermediate electrode layer is a common layer that is common between the plurality of memory cells, in which the plurality of memory cells is adjacent to each other and extends in the one direction or the other direction. The intermediate electrode layer includes a nonlinear resistive material.

According to the storage apparatus of the embodiment of the present disclosure, the memory cells each including the intermediate electrode layer between the selector element layer and the storage element layer are provided in the opposing regions between the plurality of first wiring layers that extends in the one direction and the plurality of second wiring layers that extends in the other direction. In this storage apparatus, one or more of the selector element layer, the storage element layer, and the intermediate electrode layer is the common layer for the memory cells that are adjacent to each other and that extend in the one direction or the other direction, and the intermediate electrode layer includes the nonlinear resistive material. This makes it possible to reduce occurrence of electrical short circuit between the adjacent memory cells.

According to the storage apparatus of the embodiment of the present disclosure, the nonlinear resistive material is used to form the intermediate electrode layers that configure the memory cells provided in the opposing regions between the plurality of first wiring layers and the second wiring layers that intersect each other. This reduces the occurrence of electrical short circuit between the adjacent memory cells, which makes it possible to improve the selection characteristic.

It is to be noted that effects described here are not necessarily limited, and any of effects described in the present disclosure may be possible.

MODES FOR CARRYING OUT THE INVENTION

Below, embodiments according to the present disclosure will be described in detail with reference to the drawings. The following description is merely one specific example of the present disclosure, and the present disclosure is not limited to the following embodiments. In addition, the arrangement, dimensions, dimensional ratio, or the like of individual constituent elements of the present disclosure are not limited to those illustrated in each of the drawings. It is to be noted that description will be made in the following order.

1. First Embodiment (An example in which a nonlinear resistive material is used to form an intermediate electrode layer, and a selector element layer, an intermediate electrode layer, and a storage element layer are formed as continuous films that extend in the same direction)
   1-1. Configuration of Storage Apparatus
   1-2. Operation of Storage Apparatus
   1-3. Workings and Effects
2. Second Embodiment (An example of structure in which an electric resistance, in a film-thickness direction, of an intermediate electrode layer is lower than an electric resistance between memory cells)
3. Third Embodiment (An example in which a selector element layer has a film thickness less than a distance between memory cells)
4. Modification Examples (Other examples of structure of the storage apparatus)

1. FIRST EMBODIMENT

1-1. Configuration of Storage Apparatus

Figure 1:
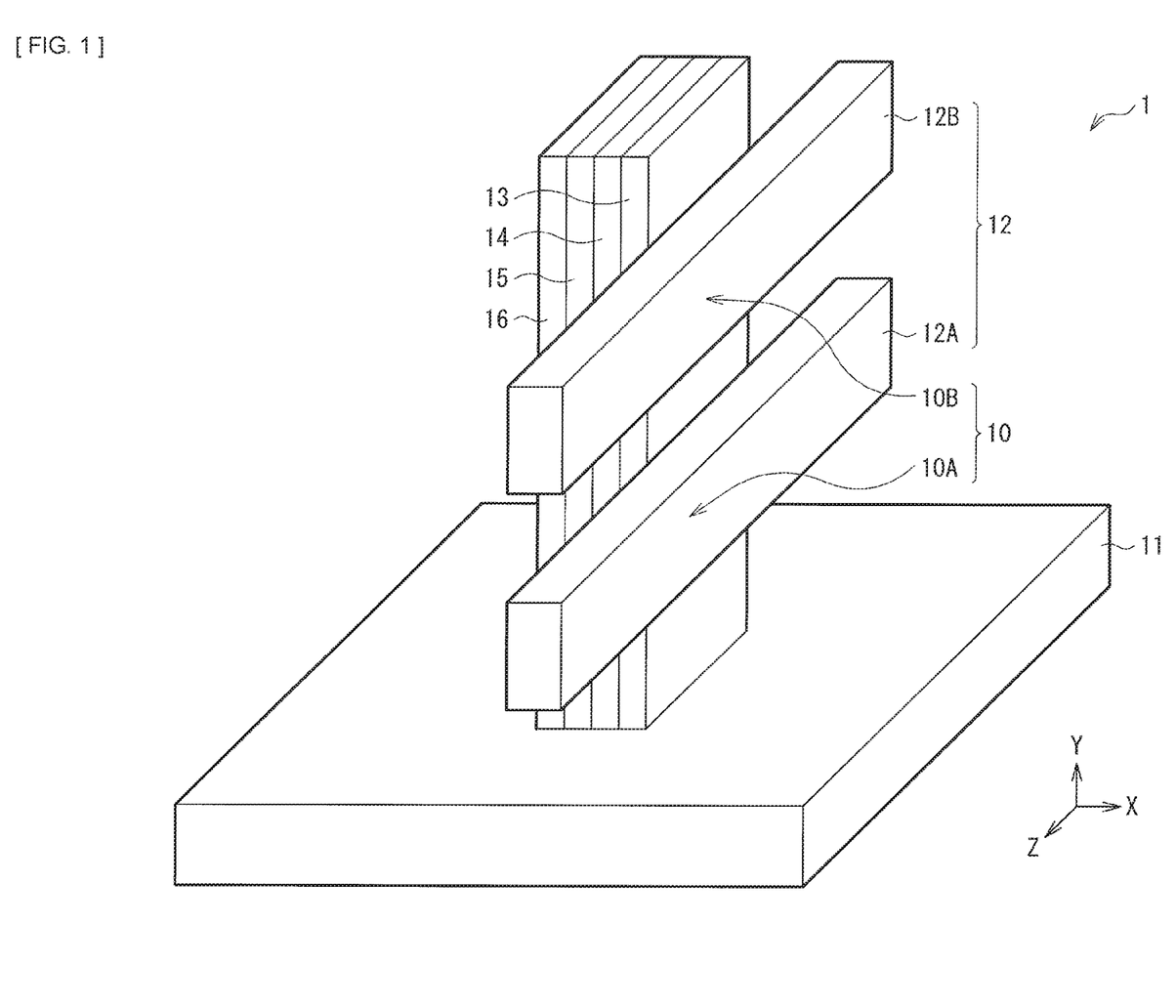
FIG. 1 is a schematic view of one example of a configuration of a storage apparatus according to a first embodiment of the present disclosure.

FIG. 1 is a diagram schematically illustrating a configuration of a storage apparatus (memory cell array 1) according to a first embodiment of the present disclosure. This memory cell array 1 is a portion of a configuration of a so-called cross point storage apparatus (memory cell array 6) illustrated, for example, in FIG. 11. In this memory cell array 1, memory cells 10 (10A and 10B) are provided at respective opposing regions (in other words, intersecting points between wiring layers 12 and wiring layers 16) of a plurality of first wiring layers (wiring layers 12 (12A and 12B)) that extends in one direction (for example, in a Z-axis direction) and a second wiring layer (wiring layer 16) that extends in another direction (for example, in a Y direction). In the present embodiment, the memory cell 10 has, for example, a configuration in which a selector element layer 13, an intermediate electrode layer 14, and a storage element layer 15 are stacked in this order from the wiring layer 12 side, and these layers 13, 14, and 15 extend in the same direction as the wiring layer 16.

The wiring layers 12 (12A, 12B) extend in a substantially horizontal direction (for example, in the Z-axis direction) with respect to, for example, a plane (XZ plane) direction of a substrate 11. The wiring layers 12 are used, for example, as word-lines (WL1 and WL2) in FIG. 6. The wiring layer 16 extends in a substantially perpendicular direction (for example, in a Y-axis direction) with respect to, for example, a plane (XZ plane) direction of the substrate 11. The wiring layer 16 is used, for example, as a pillar-line (PL1) in FIG. 6. The wiring layers 12 and the wiring layer 16 include a wiring material used in semiconductor processing, and examples of the material include, for example, tungsten (W), nitriding tungsten (WN), copper (Cu), aluminum (Al), molybdenum (Mo), tantalum (Ta), and silicide. In a case where the wiring layers 12 and 16 include a material (for example, Cu) that may cause ionic conduction in an electric field with the selector element layer 13 or the storage element layer 15, a surface of the wiring layer 12 or 16, which includes Cu, may be covered with W, WN, titanium nitride (TiN), TaN or other materials that are less likely to cause ionic conduction or thermal diffusion. Note that the substrate 11 includes a CMOS circuit, a circuit used to be coupled to an external circuit (which are not illustrated), or the like, and the wiring layers 12 and 16 may be coupled to these circuits.

The selector element layer 13 largely reduces its resistance with an increase in applied voltage, and exhibits a high-resistance state in a case where the applied voltage is low. In other words, the selector element layer 13 has a nonlinear electric-resistance characteristic of which electric resistance is high in a case where the applied voltage is low, and electric resistance largely reduces and a large current (for example, a current that is several orders of magnitude greater) flows in a case where the applied voltage is high. The selector element layer 13 may include, for example, an MSM (Metal-Semiconductor-Metal) diode, an MIM (Metal-Insulator-Metal) diode, a varistor, or an ovonic threshold switch, and may include a plurality of layers. In addition, the selector element layer 13 may use a unidirectional diode or a bidirectional diode depending on operational methods for the storage element layer 15. Note that the selector element layer 13 does not perform a memory operation in which a conductive path formed with ion migration resulting from, for example, application of voltage is maintained after the application of voltage is stopped, or the like.

Figure 2:
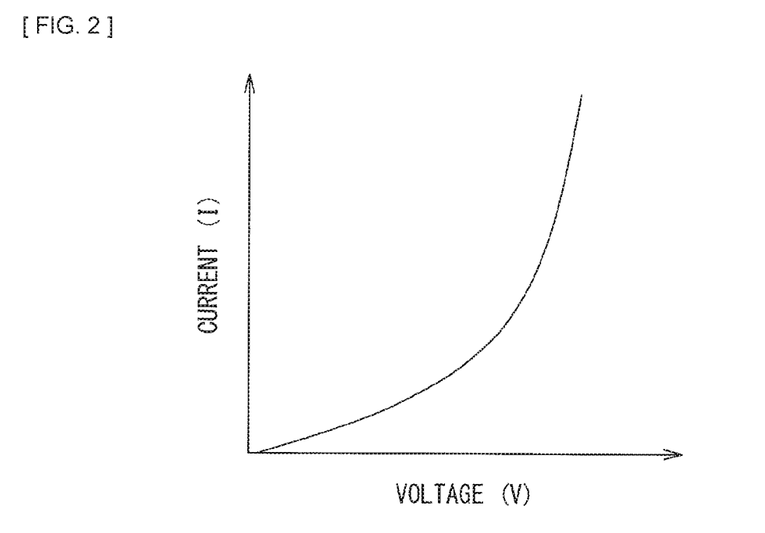
FIG. 2 is a characteristic diagram for describing an intermediate electrode layer that configures the storage apparatus illustrated in FIG. 1.

The intermediate electrode layer 14 has a nonlinear characteristic, and preferably includes a material (nonlinear resistive material) having, for example, a relationship in which a current (I) exponentially increases as a voltage (V) increases as illustrated in FIG. 2. This improves the selection characteristic of the memory cell 10. In addition, the electric resistance of the intermediate electrode layer 14 makes it possible to reduce an instantaneous current occurring at the time of operation of the memory cell 10 and also to suppress an excessive current to the storage element layer 15. Furthermore, the intermediate electrode layer 14 suppresses mutual diffusion of materials that form the selector element layer 13 and the storage element layer 15. As for the material of the intermediate electrode layer 14, it is desirable to use, for example, a semiconductor material containing nitrogen. Specifically, examples of the material of the intermediate electrode layer 14 include SiN, AlN, SiAlN, SiTiN, SiTaN, SiHfN, AlTiN, AlTaN, and AlHfN. The amount of nitride contained in these nitride semiconductor materials are adjusted to allow for a desired characteristic. In addition, the intermediate electrode layer 14 may contain germanium (Ge), oxygen (O), a chalcogenide element (for example, sulfur (S), selenium (Se), or tellurium (Te)), or the like. Note that it is preferable that the intermediate electrode layer 14 do not contain any element that is likely to react with the selector element layer 13 and the storage element layer 15. For example, it is preferable that the intermediate electrode layer 14 include elements other than the main component elements of the selector element layer 13 and the storage element layer 15. This suppresses the above-described mutual diffusion of the elements between the selector element layer 13 and the storage element layer 15.

The storage element layer 15 is a variable-resistance memory element in which a resistance value changes in a reversible manner by an electrical signal, and which has non-volatility that allows for retaining of the changed state. The principle of change in resistance is not particularly limited to a phase change, a polarization, a direction of magnetization, a formation of conductive path (filament), or the like. That is, the storage element layer 15 may use, for example, any of PCM (phase change memory element), FeRAM (ferroelectric memory element), MRAM (magnetoresistive random access memory element), and a resistive random access memory element containing transition metal oxide or chalcogenide.

Figure 3:
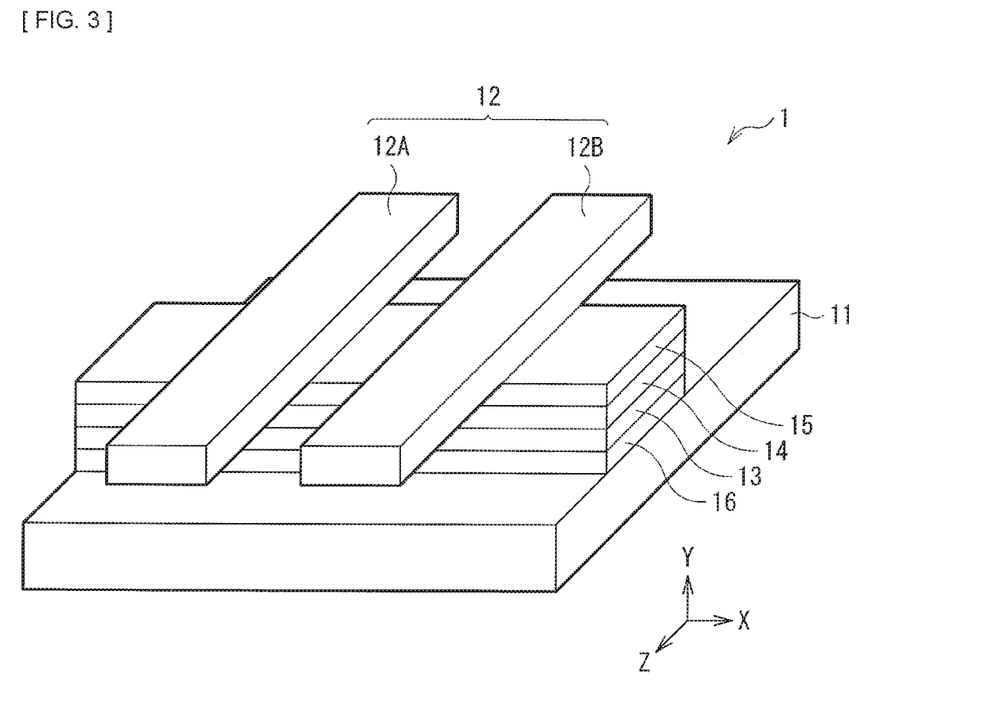
FIG. 3 is a schematic view of another example of the configuration of the storage apparatus according to the first embodiment of the present disclosure.

It should be noted that FIG. 1 illustrates an example in which the selector element layer 13, the intermediate electrode layer 14, the storage element layer 15, and the wiring layer 16 extend in the direction perpendicular to the substrate 11. However, the present disclosure is not limited to this. For example, the selector element layer 13, the intermediate electrode layer 14, the storage element layer 15, and the wiring layer 16 may extend in a direction substantially horizontal to the substrate 11 (for example, in the X-axis direction), as illustrated FIG. 3. In addition, positions of the selector element layer 13 and the storage element layer 15 may be swapped. That is, a configuration may be employed in which the storage element layer 15, the intermediate electrode layer 14, and the selector element layer 13 are stacked in this order from the wiring layer 12 side. Furthermore, another layer may be formed on upper surfaces of the wiring layer 12 and the wiring layer 16, or between individual layers of the wiring layer 12 and 16, the selector element layer 13, the intermediate electrode layer 14, and the storage element layer 15, although illustration is not given. The other layer includes a layer formed with the intention, for example, of improving an adhesive property, a planarity, and a thermal conductivity, or preventing diffusion of materials between the individual layers.

Figure 4:
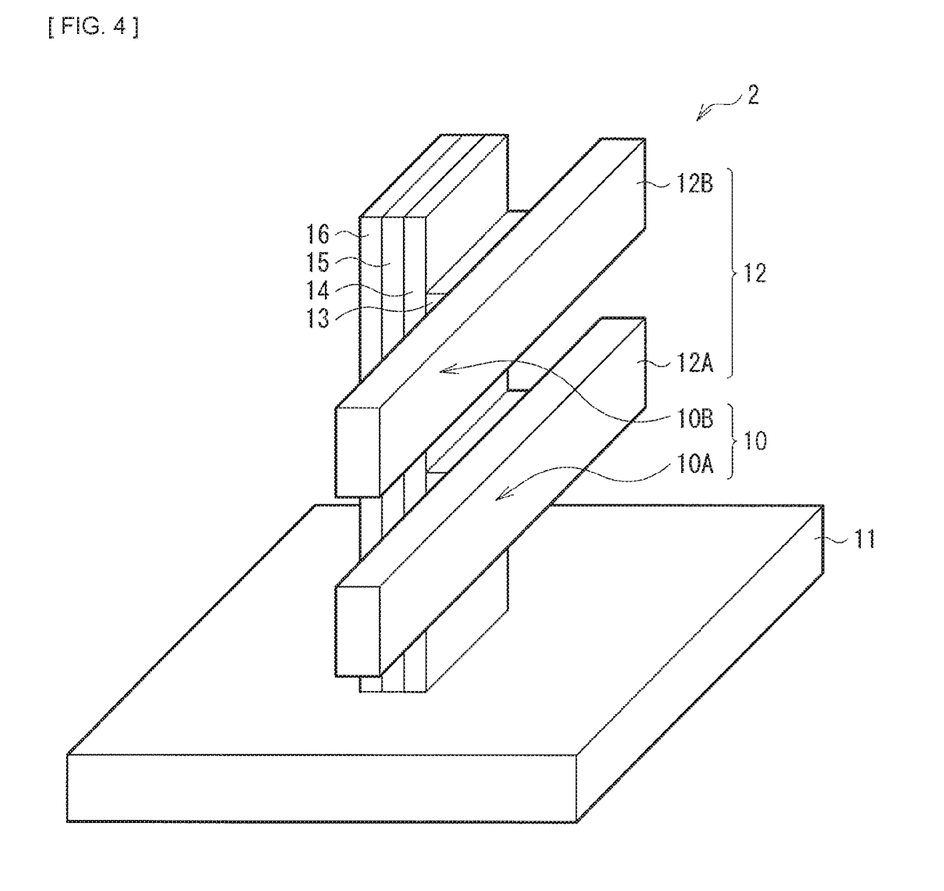
FIG. 4 is a schematic view of another example of the configuration of the storage apparatus according to the first embodiment of the present disclosure.
Figure 5:
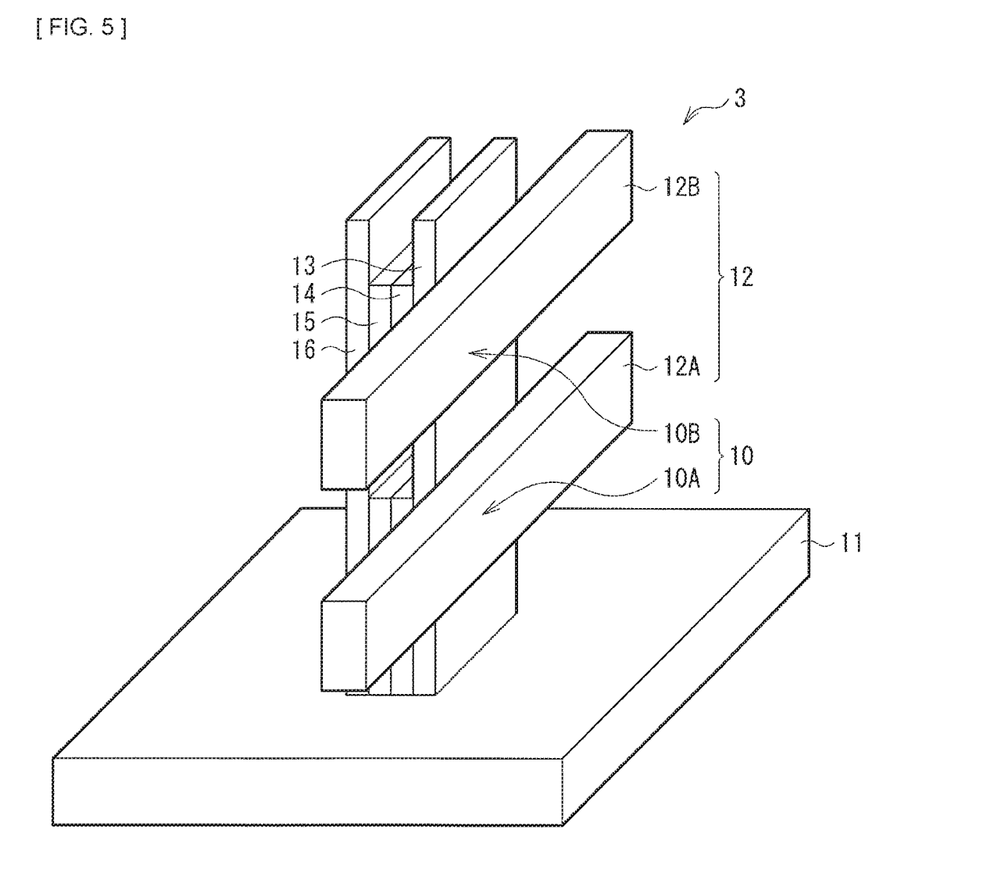
FIG. 5 is a schematic view of another example of the configuration of the storage apparatus according to the first embodiment of the present disclosure.

Furthermore, FIG. 1 illustrates an example in which all of the selector element layer 13, the intermediate electrode layer 14, and the storage element layer 15 extend in the same direction as the wiring layer 16. However, the present disclosure is not limited to this. For example, the selector element layer 13 may be formed individually for each of the memory cells 10A and 10B, as illustrated in FIG. 4. Alternatively, as illustrated in FIG. 5, the selector element layer 13 may be formed as a common layer, and the intermediate electrode layer 14 and the storage element layer 15 may be each formed individually for each of the memory cells 10A and 10B. By forming one or more layers out of the selector element layer 13, the intermediate electrode layer 14, and the storage element layer 15, which configure the memory cell 10, as the common layer, it is possible to simplify manufacturing processes, as compared with a case where individual layers that configure a memory cell are formed individually for each memory cell.

1-2. Operation of Storage Apparatus

Figure 6:
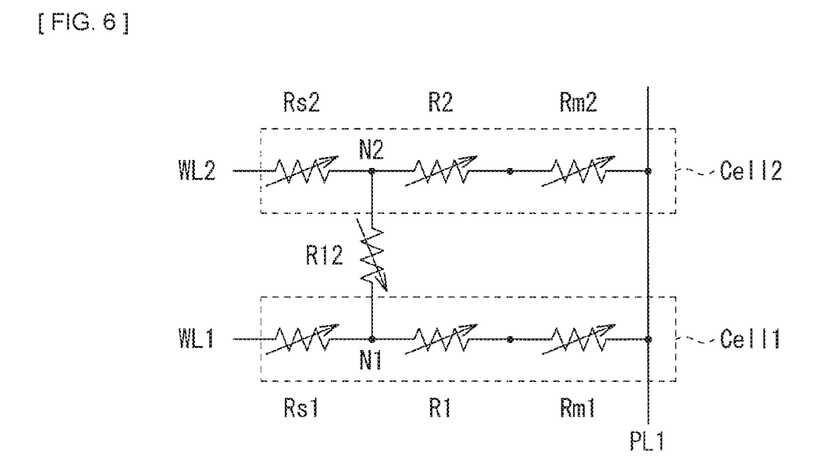
FIG. 6 is an equivalent circuit diagram of the storage apparatus illustrated in FIG. 1.

Below, operation of the memory cell array 1 will be described. In addition, effects obtained from the intermediate electrode layer 14 according to the present embodiment will also be described. FIG. 6 schematically illustrates an equivalent circuit diagram of the memory cell array 1. In FIG. 6, Rs1 represents a resistance of the selector element layer 13 at the intersecting point between the wiring layer 12A and the wiring layer 16, R1 represents a resistance of the intermediate electrode layer 14, and Rm1 represents a resistance of the storage element layer 15. In addition, Rs2 represents a resistance of the selector element layer 13 at the intersecting point between the wiring layer 12B and the wiring layer 16, R2 represents a resistance of the intermediate electrode layer 14, and Rm2 represents a resistance of the storage element layer 15. Furthermore, the word-line WL1 represents the wiring layer 12A, the word-line WL2 represents the wiring layer 12B, the pillar-line PL1 represents the wiring layer 16, N1 represents a contact point between Rs1 and R1, and N2 represents a contact point between Rs2 and R2. Moreover, cell1 represents the memory cell 10A, and cell2 represents the memory cell 10B.

Description will be made, as an example, of a case in which writing is performed on the memory cell 10A (cell1). In an initial state, both Rm1 and Rm2 are in a high-resistance state (Rm1H and Rm2H). The writing threshold voltage Vth of Rm1 is set, for example, to 3 V. At the time of writing to the memory cell 10A (cell1), a writing voltage Vset1 is applied to the word-line WL1 and the pillar-line PL1 is coupled to the ground. A voltage of Vset1/2 is applied to the word-line WL2. With the voltage setting described above, Rs2 does not make transition to the on state, and remains in the high-resistance state (off state). Only the Rs1 is in the on state, and transitions to the low-resistance state.

For example, a case of an ovonic threshold switch used as the selector element layer 13 is given. In a case where Rs1 is brought into the on state, a so-called holding voltage Vhold is generated across both ends of Rs1. Thus, the voltage to be applied to R1 and Rm1H is V1=Vset1−Vhold. At this time, with the setting of R1<Rm1H, V1 is substantially applied to Rm1H, and becomes higher than the writing threshold voltage Vth for Rm1H. With the resistance value of Rm1 being Rm1=RM1L after transitioned to a low resistance, a writing current I1 defined as V1=(R1+RM1L)=×I1 flows through Rm1.

In a case where RRAM or PCM is used as the storage element layer 15, RM1L×I1 typically becomes almost a constant value of Vcell1. Thus, I1=(V1−Vcell1)/R1 is set. Here, to ensure Rm1 has a sufficient long-term storage reliability, I1 is desirable to be large, and lower R1 is more advantageous. For example, in a case of V1=5 V and Vcell1=1 V, to secure the reliability, a voltage of 4 V is applied to R1 with the current I1 being set, for example, to 40 μA, in which case R1<100 kΩ serves as a rough standard.

Incidentally, at the time of writing to the memory cell 10A, writing should not be performed on the memory cell 10B. In FIG. 6, a difference between the memory cell 10A (cell1) and the memory cell 10B (cell2) is R12. With R12 being set to have a sufficiently high resistance, the voltage to be applied to Rm2 is set to be lower than the writing threshold voltage Vth. With Rm2, which is in the high-resistance state, being set to Rm2=Rm2H, the voltage VRm2H to be applied to Rm2 is VRm2H=V1×Rm2H/(R12+Rm2H) because of R2<<Rm2H. In general, resistance values of RRAM and PCM in the high-resistance state is 1 MΩ or higher. R12 is desirable to be about 1 MΩ to prevent VRm2H from being excessively high. In a case of Rm2=R12=1 MΩ, a voltage of V1/2 is to be applied to R12 and Rm2. For example, in a case of V1=5 V, V1/2=2.5 V establishes, and no writing is performed on the memory cell 10B. Thus, it is preferable that the electric resistance R1 of the intermediate electrode layer 14 be 100 kΩ or less, for example, at the time of the applied voltage being 4 V. In addition, it is preferable that the electric resistance R1 be 1 MkΩ or higher, for example, at the time of the applied voltage being 2.5 V. In other words, it is required that the voltage-current characteristic is a nonlinear.

Figure 7:
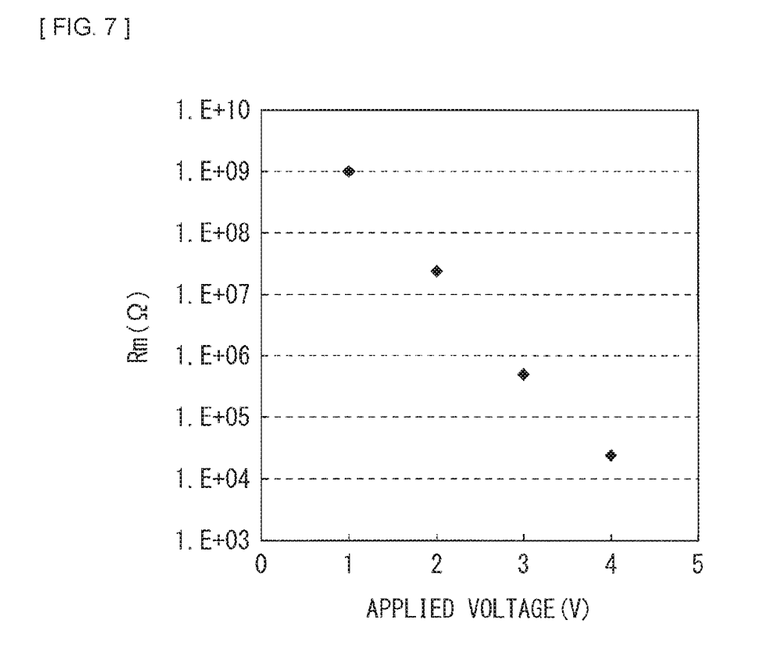
FIG. 7 is a diagram concerning a nonlinear characteristic of the intermediate electrode layer that configures the storage apparatus illustrated in FIG. 1.

FIG. 7 illustrates a nonlinear characteristic of a memory cell array 1 including the intermediate electrode layer 14 according to the present embodiment. In FIG. 7, the resistance value reduces with an increase in the applied voltage, which exhibits a nonlinear characteristic. Note that this result corresponds to a case where the intermediate electrode layer 14 is formed as a Si-rich SiN film having a film thickness of 10 nm.

1-3. Workings and Effects

As described above, a cross point memory having memory elements and selector elements combined therein is proposed as a way to achieve high-capacity and high-speed memory or storage. The cross point memory includes a plurality of wiring layers extending in one direction and another direction, and has a configuration in which a memory cell having a memory element and a selector element coupled in series is disposed between wiring lines where the plurality of wiring layers intersect each other. Thus, one wiring layer is shared between plural memory cells.

As for a method of further increasing a capacity of the cross point memory, it may be considered, for example, to stack the cross point memories formed into a planar shape. However, it is said that there is a limitation on stacking of the cross point memories due to manufacturing cost. Thus, development is shifting toward a memory having a three dimensional solid structure in which one of two types of intersecting wiring layers extends in a perpendicular direction with respect to the plane to form a memory cell in the perpendicular direction, which is recognized as a highly potential development.

Such a memory having a three dimensional solid structure is considered to have, for example, a structure in which: a plurality of wiring layers extending in a horizontal direction with respect to a substrate are stacked in a perpendicular direction; an opening penetrating, for example, in the perpendicular direction with respect to the substrate is formed between the wiring lines; and a memory cell structure body is provided within the opening. In the memory cell structure body, the individual layers that configure the memory cell are formed sequentially in a film shape on a side wall of the opening to form a concentrically stacked structure. In such a memory cell structure body, it is preferable that each of the layers have a thin film thickness. In a case of the three dimensional memory array architecture described above, a storage element material and a cell select material that configure the memory cell structure body are continuously formed in a film shape, and the memory cell structure body is shared between the plural layers.

In a case of the cross point memory, however, one wiring layer is shared between plural memory cells as described above. Thus, at the time of selecting one memory cell to operate the one memory cell, a voltage is applied not only to the selected memory cell (selected cell) but also to other memory cells (non-selected cells) with which a wiring layer is shared, which possibly causes malfunction.

In addition, in order to secure characteristics of memory cell, it is important to prevent deterioration resulting from mutual interference between the selector element and the memory element. As for a method of achieving this, it may be considered that an intermediate electrode layer is provided between the selector element and the memory element. In a case of the resistance-change memory cell array described above, the array includes a variable resistance film (memory element), a conductive layer (intermediate electrode layer), and a rectifying insulating film (selector element) to suppress the mutual interference between the selector element and the memory element, thereby securing the characteristics of the memory cell as well as preventing the deterioration. In the typical intermediate electrode layer, however, there is a possibility that electrical short circuit defect occurs between adjacent memory cells. The occurrence of electrical short circuit defect between the adjacent memory cells leads to a malfunction of non-selected cell. For the foregoing reasons, the cross point memory is required to have improved selection characteristic.

In contrast, the memory cell 10 according to the present embodiment has, for example, the configuration in which the selector element layer 13, the intermediate electrode layer 14, and the storage element layer 15 are stacked in this order from the wiring layer 12 side, and these individual layers 13, 14, and 15 extend in the same direction as the wiring layer 16. That is, these individual layers 13, 14, and 15 are formed as continuous films that extend in the Y-axis direction, and serve as the common layers in the memory cell 10A and the memory cell 10B arranged in the Y-axis direction. In the present embodiment, the nonlinear resistive material is used to form the intermediate electrode layer 14. This makes it possible to reduce the occurrence of electrical short circuit between the memory cell 10A and the memory cell 10B adjacent to each other.

For these reasons, in the memory cell array 1 according to the present embodiment, the memory cell 10 provided at the intersecting point between the wiring layer 12 and the wiring layer 16 that intersect each other has the configuration in which the selector element layer 13 and the storage element layer 15 are stacked with the intermediate electrode layer 14 being disposed therebetween. In addition, this intermediate electrode layer 14 includes the nonlinear resistive material. This reduces the occurrence of electrical short circuit between the memory cell 10A and the memory cell 10B adjacent to each other. Thus, it is possible to improve the selection characteristic.

Incidentally, as for a method of preventing the defect in which the intermediate electrode layer disposed between the selector element and the storage element develops an electrical short circuit with adjacent cells, it may be considered to divide the intermediate electrode layer for each cell, or partially form a high-resistance region on the intermediate electrode layer through oxidation or the like to bring adjacent cells into an insulated state, or the like. This, however, poses a problem in that the number of manufacturing steps increases accordingly.

In contrast, in the present embodiment, the selector element layer 13, the intermediate electrode layer 14, and the storage element layer 15 together with the wiring layer 16 are formed as the continuous films that extend in the Y-axis direction, which makes it possible to simplify the manufacturing processes of the memory cell array 1, as compared with a case where individual layers that constitute the memory cell are formed individually for each memory cell. That is, it is possible to achieve both the easiness of manufacturing processes and the high selection characteristic, by configuring the memory cell 10 formed in the opposing region between the wiring layer 12 and the wiring layer 16 such that the selector element layer 13 and the storage element layer 15 are stacked with the intermediate electrode layer 14 including the nonlinear resistive material being disposed therebetween, and also by forming the selector element layer 13, the intermediate electrode layer 14, and the storage element layer 15 as the continuous films that extend, for example, in the same direction as the wiring layer 16, as in the present embodiment.

Next, second and third embodiments as well as modification examples will be described. In the following description, constituent elements similar to those in the first embodiment described above are denoted with the same reference characters, and description thereof will not be made as appropriate.

2. SECOND EMBODIMENT

Figure 8:
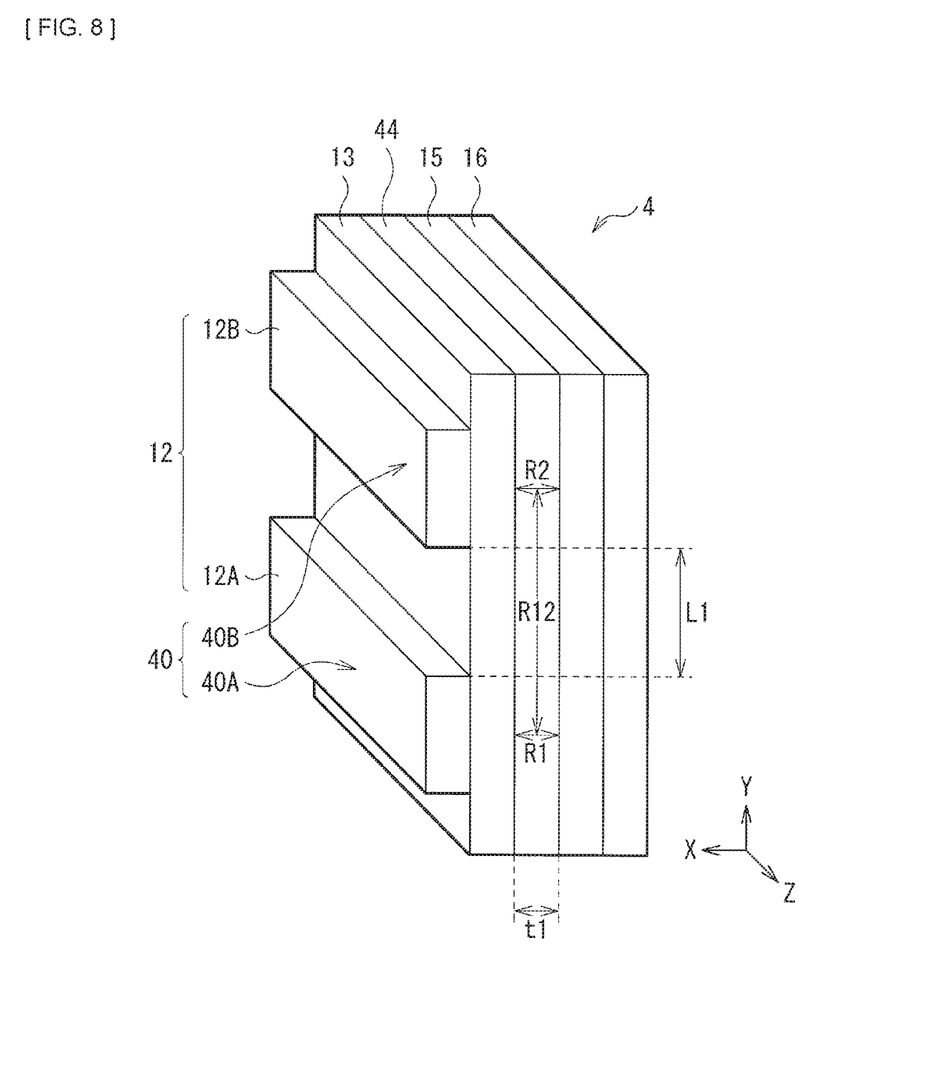
FIG. 8 is a schematic view of a configuration of a storage apparatus according to a second embodiment of the present disclosure.

FIG. 8 schematically illustrates a configuration of a storage apparatus (memory cell array 4) according to a second embodiment of the present disclosure. As with the memory cell array 1 or the like according to the first embodiment described above, the memory cell array 4 is, for example, a portion of the configuration of the so-called cross point storage apparatus (memory cell array 6) illustrated in FIG. 11, and memory cells 40 (40A and 40B) are provided in the respective opposing regions where the plurality of first wiring layers (wiring layers 12 (12A and 12B)) that extends in one direction (for example, in the Z-axis direction) and the second wiring layer (wiring layer 16) that extends in another direction (for example, in the Y direction) intersect each other. The present embodiment has a configuration in which an electric resistance (for example, an electric resistance R1 of the memory cell 40A), in the film-thickness direction (in the X-axis direction), of an intermediate electrode layer 44 at the memory cell 40 provided in the opposing region between the wiring layer 12A and the wiring layer 16 is lower than an electric resistance R12 of the intermediate electrode layer 44 in an adjacent non-opposing region (for example, between the memory cell 40A and the memory cell 40B).

The intermediate electrode layer 44 has the nonlinear characteristic, and suppresses the mutual diffusion of materials that constitute the selector element layer 13 and the storage element layer 15, as with the intermediate electrode layer 24 described above. As for a material that forms the intermediate electrode layer 44, it is preferable to use a nonlinear resistive material, and it is desirable, for example, to use a semiconductor material containing nitrogen. Specifically, the material includes, for example, SiN, AlN, SiAlN, SiTiN, SiTaN, SiHfN, AlTiN, AlTaN, and AlHfN. It is possible to obtain a desired property by adjusting the amount of nitrogen contained in the nitrides semiconductor material. In addition, the intermediate electrode layer 44 may contain germanium (Ge), oxygen (O), a chalcogenide element (for example, sulfur (S), selenium (Se), or tellurium (Te)), or the like. Note that it is preferable that the intermediate electrode layer 44 do not contain any element that is likely to react with the selector element layer 13 and the storage element layer 15, which makes it possible to suppress the mutual diffusion.

As for a method of causing the electric resistance R1, in the film-thickness direction, of the intermediate electrode layer 44 at the memory cell 40A to be lower and causing the electric resistance R12 of the intermediate electrode layer 44 between the memory cell 40A and the memory cell 40B adjacent to each other to be higher, it is preferable that the film thickness t1 of the intermediate electrode layer 44 be less than a distance L1 between the memory cell 40A and the memory cell 40B adjacent to each other. This enables the electric resistance R1 of the intermediate electrode layer 44 to be relatively low. In other words, by increasing a distance between the wiring layer 12A and the wiring layer 12B, it is possible to set the electric resistance R12 of the intermediate electrode layer 44 to be higher. In this case, stability improves although an area efficiency is sacrificed in the memory cell array. Alternatively, it is possible to increase the resistance of the intermediate electrode layer 44 by intentionally oxidizing or damaging a portion of the intermediate electrode layer 44. In addition, for example, in a case where the intermediate electrode layer 44 has a stacked structure and the material thereof has an anisotropic resistance, it is possible to make the electric resistance R1 relatively lower.

To achieve a configuration that suppresses erroneous writing to an adjacent memory cell in the memory cell array, it is preferable that the electric resistance of the intermediate electrode layer 44 be set such that the electric resistance R1 in the film-thickness direction (in the X-axis direction) is lower and the electric resistance R12 in the extending direction (in the Y-axis direction) is higher, as in the first embodiment described above. In the present embodiment, for example, the electric resistance R1, in the film-thickness direction, of the intermediate electrode layer 44 at the memory cell 40A is set to be lower, and the electric resistance R12 of the intermediate electrode layer 44 between adjacent memory cell 40A and memory cell 40B is set to be higher, which makes it possible to suppress the occurrence of erroneous writing and to further improve the selection characteristic.

3. THIRD EMBODIMENT

Figure 9:
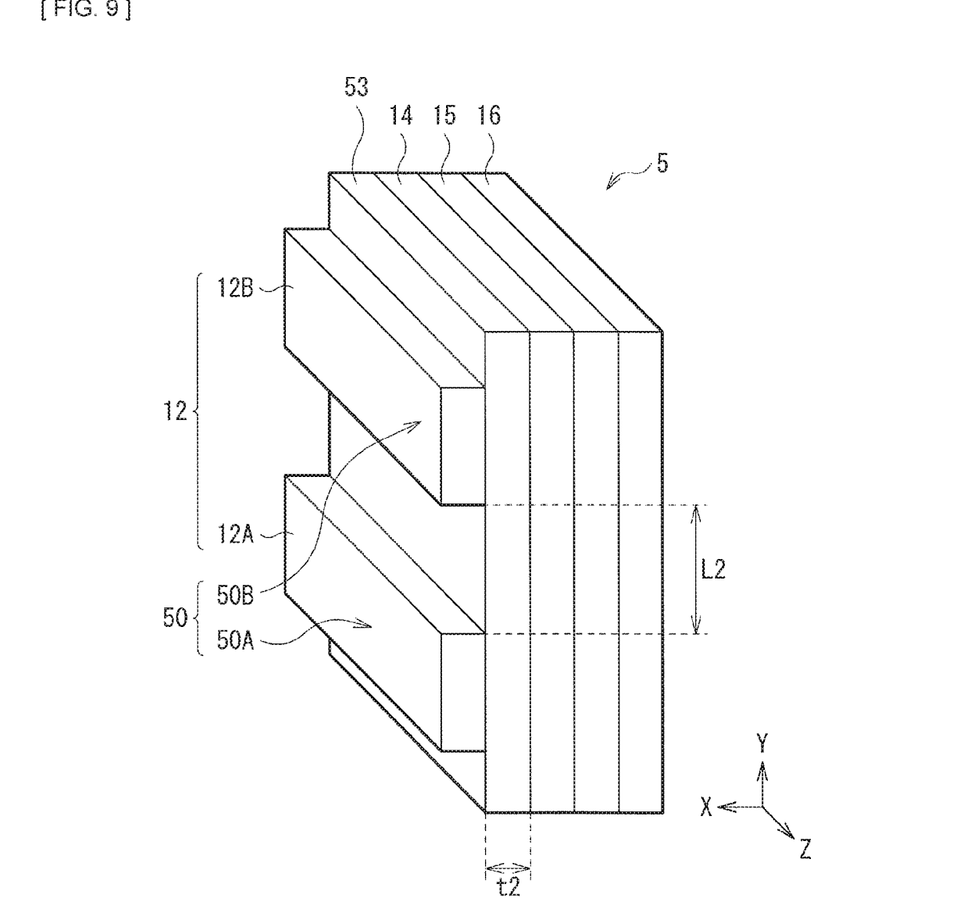
FIG. 9 is a schematic view of a configuration of a storage apparatus according to a third embodiment of the present disclosure.

FIG. 9 schematically illustrates a configuration of a storage apparatus (memory cell array 5) according to a third embodiment of the present disclosure. As with the memory cell array 1 or the like according to the first embodiment described above, this memory cell array 5 is, for example, a portion of the configuration of the so-called cross point storage apparatus (memory cell array 6) illustrated in FIG. 11, and memory cells 50 (50A and 50B) are provided in the respective opposing regions where the plurality of first wiring layers (wiring layers 12 (12A and 12B)) that extends in one direction (for example, in the Z-axis direction) and the second wiring layer (wiring layer 16) that extends in another direction (for example, in the Y direction) intersect each other. The present embodiment has a configuration in which an electric resistance Rs1, in the film-thickness direction (in the X-axis direction), of a selector element layer 53 at the memory cell 50 (for example, the memory cell 50A)

provided in the opposing region between the wiring layer 12A and the wiring layer 16 is lower than an electric resistance Rs12 of the selector element layer 53 in an adjacent non-opposing region (for example, between the memory cell 50A and the memory cell 50B).

The selector element layer 53 has a resistance that largely reduces with an increase in the applied voltage, and exhibits a high resistance state in a case where the applied voltage is low. The selector element layer 53 may use, for example, the MSM diode, the MIM diode, the varistor, or the ovonic threshold switch, and may include a plurality of layers. In addition, the selector element layer 53 may use the unidirectional diode or the bidirectional diode depending on operation methods for the storage element layer 15. Note that the selector element layer 53 does not perform a memory operation in which a conductive path formed with ion migration resulting from, for example, application of voltage is maintained after the application of voltage is stopped, or the like.

In the first embodiment or the like described above, to achieve the configuration that suppresses the erroneous writing to adjacent memory cells in the memory cell array, it is preferable that the electric resistance R12 of the intermediate electrode layer 14 in the extending direction be higher than the electric resistance R1 in the film-thickness direction. This applies similarly to the selector element layer 13 in terms of the electric resistance in the extending direction.

Figure 10:
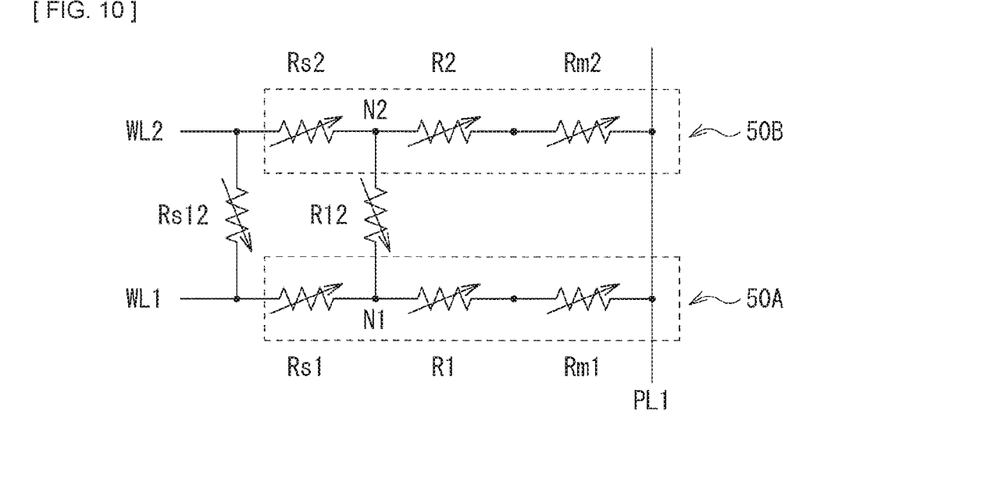
FIG. 10 is an equivalent circuit diagram of the storage apparatus illustrated in FIG. 9.

FIG. 10 illustrates an equivalent circuit of the memory cell array 5 according to the present embodiment. In a case where the electric resistance Rs12 of the selector element layer 53 in the extending direction (in the Y-axis direction) is excessively low, the selector element layer 53 does not work as the selector element, which causes a malfunction. Thus, it is preferable to set the film thickness t2 of the selector element layer 53 in the stacking direction (in the X-axis direction) to be less than a distance L2 between adjacent memory cell 50A and memory cell 50B that are disposed adjacent to each other. This enables the electric resistance Rs1 of the selector element layer 53 to be relatively low. In other words, by increasing the distance between the wiring layer 12A and the wiring layer 12B, it is possible to increase the electric resistance Rs12 of the selector element layer 53.

As described above, the present embodiment is configured, for example, such that the electric resistance R1, in the film-thickness direction, of the selector element layer 53 at the memory cell 50A is lower and the electric resistance R12 of the selector element layer 53 between the memory cell 50A and the memory cell 50B that are adjacent to each other is higher, which makes it possible to suppress the occurrence of erroneous writing as well as to further improve the selection characteristic.

It should be noted that, in the present embodiment, the selector element layer 53 is required to be formed as a continuous film that continues between the memory cell 50A and the memory cell 50B that are adjacent to each other. However, the intermediate electrode layer 14 and the storage element layer 15 may be formed individually for each of the memory cell 50A and the memory cell 50B. In this case, the intermediate electrode layer 14 may not necessarily have the nonlinear characteristic. However, in a case where the intermediate electrode layer 14 is formed using a material having a nonlinear characteristic, the selection characteristic of the memory cell 50A improves as described above. In addition, the instantaneous current occurring at the time of operation of the memory cell 50A reduces owing to the electric resistance of the intermediate electrode layer 14, which enables suppression of the excessive current to the storage element layer 15.

4. MODIFICATION EXAMPLES

Modification Example 1

Figure 11:
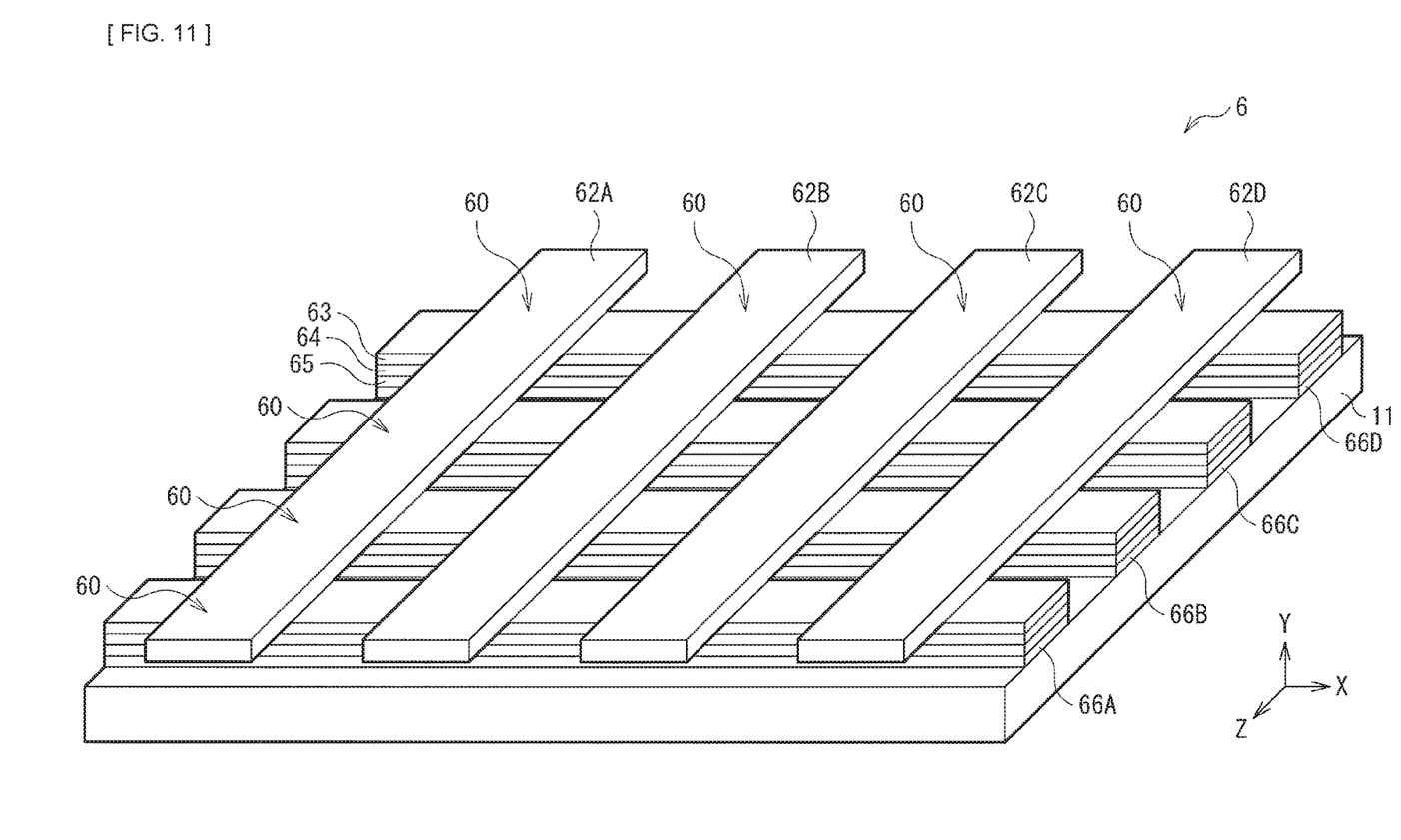
FIG. 11 is a schematic view of a configuration of a storage apparatus according to modification example 1 of the present disclosure.

FIG. 11 schematically illustrates one example of a configuration of a storage apparatus (memory cell array 6) according to modification example 1 of the present disclosure. This memory cell array 6 is, for example, an expansion of the memory cell array 1 illustrated in FIG. 3. The memory cell array 6 includes a plurality of wiring layers 62 (62A, 62B, 62C, and 62D) and a plurality of wiring layers 66 (66A, 66B, 66C, and 66D), and a selector element layer 63, an intermediate electrode layer 64, and a storage element layer 65 are formed as continuous films along individual wiring layers 66A, 66B, 66C, and 66D. In this memory cell array 6, the selector element layer 63, the intermediate electrode layer 64, and the storage element layer 65 are shared between the individual wiring layers 62A, 62B, 62C, and 62D. That is, the memory cell array 6 is a cross point memory cell array that includes the memory cells 10 at positions (cross points) where the plurality of wiring layers 62 (62A, 62B, 62C, and 62D) that extend, for example, in the Z-axis direction and the plurality of wiring layers 66 (66A, 66B, 66C, and 66D) that extend, for example, in the Z-axis direction face each other. In addition, the memory cell array 6 corresponds to one specific example of the storage apparatus according to the present disclosure.

Modification Example 2

Figure 12:
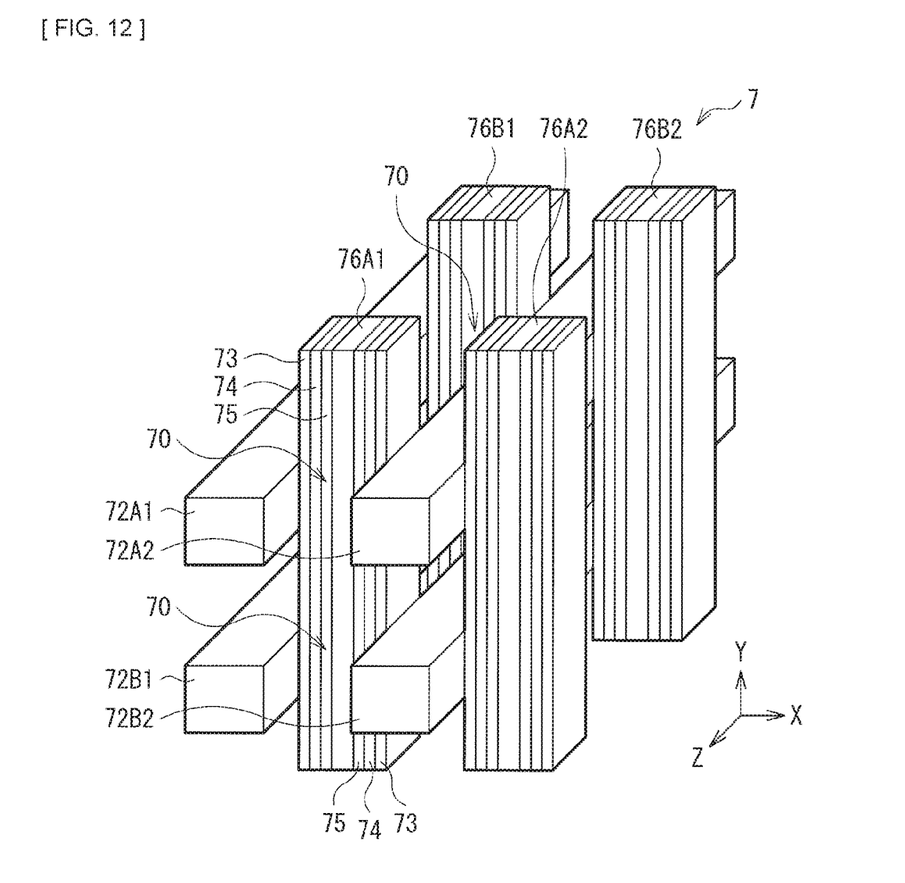
FIG. 12 is a schematic view of a configuration of a storage apparatus according to modification example 2 of the present disclosure.

FIG. 12 schematically illustrates a configuration of a storage apparatus (memory cell array 7) according to modification example 2 of the present disclosure. This memory cell array 7 has, for example, a three dimensional structure in which a plurality of wiring layers 72 (a wiring layer 72A1 and a wiring layer 72A2, and a wiring layer 72B1 and a wiring layer 72B2) that extends in the Z-axis direction and a plurality of wiring layers 76 (a wiring layer 76A1 and a wiring layer 76A2, and a wiring layer 76B1 and a wiring layer 76B2) that extends in the Y-axis direction are each layered in the X-axis direction. This memory cell array 7 has a configuration in which a storage element layer 75, an intermediate electrode layer 74, and a selector element layer 73 are stacked in this order on both sides of the wiring layer 76.

Modification Example 3

Figure 13:
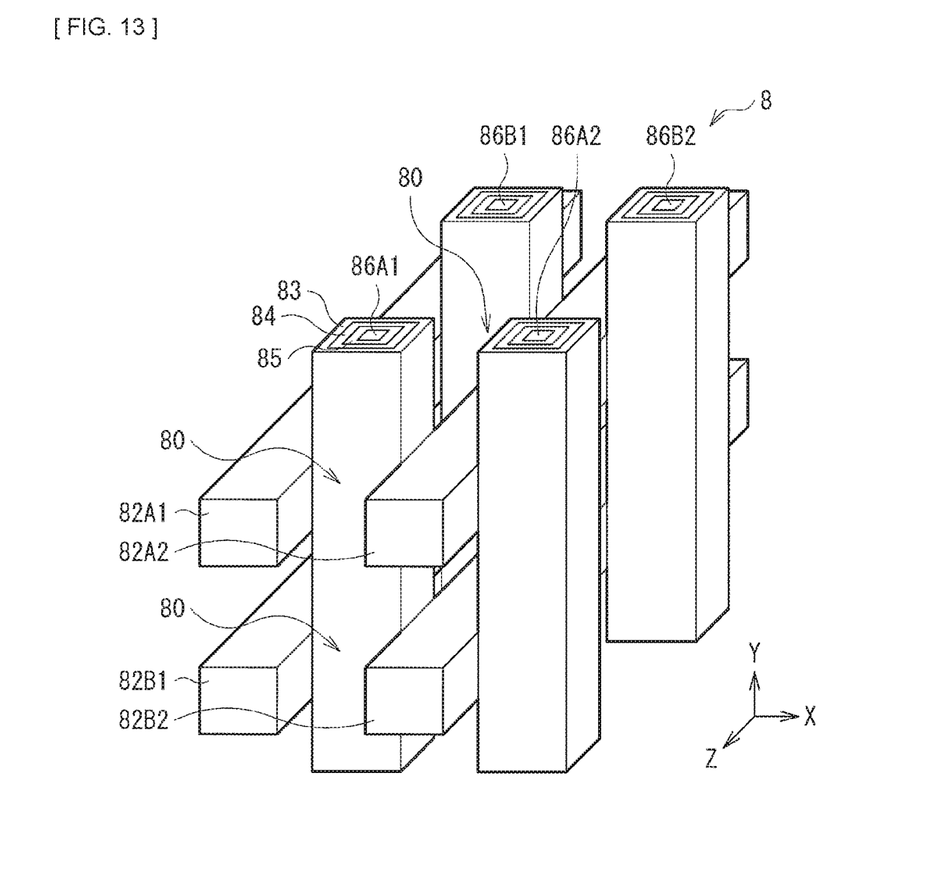
FIG. 13 is a schematic view of a configuration of a storage apparatus according to modification example 3 of the present disclosure.

FIG. 13 schematically illustrates a configuration of a storage apparatus (memory cell array 8) according to modification example 3 of the present disclosure. This memory cell array 8 has, for example, a three dimensional structure in which a plurality of wiring layers 82 (a wiring layer 82A1 and a wiring layer 82A2, and a wiring layer 82B1 and a wiring layer 82B2) that extends in the Z-axis direction and a plurality of wiring layers 86 (a wiring layer 86A1 and a wiring layer 86A2, and a wiring layer 86B1 and a wiring layer 86B2) that extends in the Y-axis direction are each layered in the X-axis direction, as with the memory cell array 7 according to the modification example 2 described above. This memory cell array 8 has a configuration in which the entire side surface of the wiring layer 86 is covered with a storage element layer 85, an intermediate electrode layer 84, and a selector element layer 83 in this order. That is, the memory cell array 8 has a configuration in which, with the wiring layer 86 being the center, the intermediate electrode layer 84 and the selector element layer 83 are stacked concentrically in this order.

The memory cell arrays 7 and 8 described in the modification examples 2 and 3 each have the three dimensional structure in which the plurality of memory cells is disposed in a plane (two-dimensionally, for example, in a YZ plane direction), and is stacked in the X-axis direction as described above. With the memory cell arrays 7 and 8 each being configured as a three dimensional structure, it is possible to provide a storage apparatus having higher density and increased capacity.

Although the present disclosure has been described with reference to the first to third embodiments and the modification examples (modification examples 1 to 3) thereof, the content of the present disclosure is not limited to these embodiments described above or the like, and various modifications are possible. For example, although illustration is not given, for example, an insulating film may be formed in a space between wiring layers 12A and 12B in FIG. 1 or in a space between individual wiring layers 12 and 16 in FIG. 12.

Furthermore, for example, a cross-sectional shape of the wiring layer 12 or 16 is illustrated to have a rectangle shape in the modification examples 2 and 3. However, the shape thereof is not limited to this. For example, a cross-sectional shape of the wiring layer 86 that extends in the Y-axis direction may be formed into a circular shape, an elliptical shape or other shapes. In addition, the storage apparatus according to the present disclosure may have a structure in which the first to third embodiment and the modification examples 1 to 3 are combined with each other.

It should be noted that the effects described in the present specification are merely examples, and the effects of the present disclosure are not limited to those described in the present specification. In addition, the content of the present disclosure may have effects other than the effects described in the present specification.

Furthermore, the present disclosure may have, for example, the following configurations.

(1)

A storage apparatus including:

a plurality of first wiring layers extending in one direction;

a plurality of second wiring layers extending in another direction; and a plurality of memory cells provided in respective opposing regions in which the plurality of first wiring layers and the plurality of second wiring layers are opposed to each other, the plurality of memory cells each including a selector element layer, a storage element layer, and an intermediate electrode layer provided between the selector element layer and the storage element layer, one or more of the selector element layer, the storage element layer, and the intermediate electrode layer being a common layer that is common between the plurality of memory cells, the plurality of memory cells being adjacent to each other and extending in the one direction or the other direction, the intermediate electrode layer including a nonlinear resistive material.

(2)

The storage apparatus according to (1) described above, in which the intermediate electrode layer is formed as the common layer.

(3)

The storage apparatus according to (1) described above, in which the selector element layer is formed as the common layer.

(4)

The storage apparatus according to (1) described above, in which the storage element layer is formed as the common layer.

(5)

The storage apparatus according to (1) described above, in which the intermediate electrode layer and the selector element layer each extend in the one direction or the other direction.

(6)

The storage apparatus according to (1) described above, in which the intermediate electrode layer and the storage element layer each extend in the one direction or the other direction.

(7)

The storage apparatus according to (1) described above, in which the selector element layer and the storage element layer each extend in the one direction or the other direction.

(8)

The storage apparatus according to (1) described above, in which the selector element layer, the storage element layer, and the intermediate electrode layer each extend in the one direction or the other direction.

(9)

The storage apparatus according to any one of (1) to (7) described above, in which two or more of the selector element layer, the storage element layer, and the intermediate electrode layer extend in a same direction.

(10)

The storage apparatus according to any one of (1) to (8) described above, in which the selector element layer, the storage element layer, and the intermediate electrode layer extend in a same direction.

(11)

The storage apparatus according to any one of (1) to (10) described above, in which the plurality of first wiring layers, the plurality of second wiring layers, and the plurality of memory cells are disposed on a substrate, and the plurality of first wiring layers and the plurality of second wiring layers extend in a direction that is substantially horizontal to the substrate.

(12)

The storage apparatus according to any one of (1) to (10) described above, in which the plurality of first wiring layers, the plurality of second wiring layers, and the plurality of memory cells are disposed on a substrate, and the plurality of first wiring layers or the plurality of second wiring layers extends in a direction that is substantially perpendicular to the substrate.

(13)

The storage apparatus according to any one of (1) to (12) described above, in which an electric resistance, in a film-thickness direction, of the intermediate electrode layer in the opposing region is lower than an electric resistance in a non-opposing region, the non-opposing region being positioned between the plurality of first wiring layers adjacent to each other.

(14)

The storage apparatus according to any one of (1) to (13) described above, in which the selector element layer has a film thickness that is less than a distance between the plurality of first wiring layers adjacent to each other.

(15)

The storage apparatus according to any one of (1) to (14) described above, in which the intermediate electrode layer includes an element that is other than a main component element that configures the selector element layer and the storage element layer.

(16)

The storage apparatus according to any one of (1) to (15) described above, in which the selector element layer largely reduces its resistance with an increase in an applied voltage, and exhibits a high resistance state in a case where the applied voltage is low.

(17)

The storage apparatus according to any one of (1) to (16) described above, in which the storage element layer comprises any of: a phase change memory element; a ferroelectric memory element; a resistive random access memory element containing transition metal oxide or chalcogenide; and a magnetoresistive random access memory element.

The present application claims priority based on Japanese Patent Application No. 2017-078256 filed with the Japan Patent Office on Apr. 11, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A storage apparatus, comprising:
a plurality of first wiring layers that extends in a first direction;
a plurality of second wiring layers that extends in a second direction; and
a plurality of memory cells, wherein
each memory cell of the plurality of memory cells is in a respective opposing region of a plurality of opposing regions,
the plurality of first wiring layers is opposite to the plurality of second wiring layers,
each memory cell of the plurality of memory cells includes a selector element layer, a storage element layer, and an intermediate electrode layer,
the intermediate electrode layer is between the selector element layer and the storage element layer,
at least one of the selector element layer, the storage element layer, or the intermediate electrode layer is a common layer between the plurality of memory cells,
the plurality of memory cells is adjacent to each other and extends in one of the first direction or the second direction,
the intermediate electrode layer includes a nonlinear resistive material,
an electric resistance in a film-thickness direction of the intermediate electrode layer in the respective opposing region is lower than an electric resistance of the intermediate electrode layer in a non-opposing region, and
the non-opposing region is between the plurality of first wiring layers that are adjacent to each other.

2. The storage apparatus according to claim 1, wherein the intermediate electrode layer is the common layer.

3. The storage apparatus according to claim 1, wherein the selector element layer is the common layer.

4. The storage apparatus according to claim 1, wherein the storage element layer is the common layer.

5. The storage apparatus according to claim 1, wherein each of the intermediate electrode layer and the selector element layer extends in one of the first direction or the second direction.

6. The storage apparatus according to claim 1, wherein each of the intermediate electrode layer and the storage element layer extends in one of the first direction or the second direction.

7. The storage apparatus according to claim 1, wherein each of the selector element layer and the storage element layer extends in one of the first direction or the second direction.

8. The storage apparatus according to claim 1, wherein each of the selector element layer, the storage element layer, and the intermediate electrode layer extends in one of the first direction or the second direction.

9. The storage apparatus according to claim 1, wherein at least two of the selector element layer, the storage element layer, or the intermediate electrode layer extend in a same direction.

10. The storage apparatus according to claim 1, wherein each of the selector element layer, the storage element layer, and the intermediate electrode layer extends in a same direction.

11. The storage apparatus according to claim 1, wherein
the plurality of first wiring layers, the plurality of second wiring layers, and the plurality of memory cells are on a substrate, and
the plurality of first wiring layers and the plurality of second wiring layers extend in a direction that is horizontal to the substrate.

12. The storage apparatus according to claim 1, wherein
the plurality of first wiring layers, the plurality of second wiring layers, and the plurality of memory cells are on a substrate, and
one of the plurality of first wiring layers or the plurality of second wiring layers extends in a direction that is perpendicular to the substrate.

13. The storage apparatus according to claim 1, wherein
a film thickness of the selector element layer is less than a distance between a third wiring layer of the plurality of first wiring layers and a fourth wiring layer of the plurality of first wiring layers, and
the third wiring layer is adjacent to the fourth wiring layer.

14. The storage apparatus according to claim 1, wherein
the intermediate electrode layer includes an element different from a main component element, and
each of the selector element layer and the storage element layer includes the main component element.

15. The storage apparatus according to claim 1, wherein
resistance of the selector element layer decreases with an increase in an applied voltage, and
the selector element layer exhibits a high resistance state based on low applied voltage.

16. The storage apparatus according to claim 1, wherein the storage element layer comprises one of a phase change memory elemen, a ferroelectric memory element, a resistive random access memory element containing that contains one of transition metal oxide or chalcogenide, or a magnetoresistive random access memory element.

* * * * *